United States Patent
Okino et al.

(10) Patent No.: US 9,859,119 B2
(45) Date of Patent: Jan. 2, 2018

(54) SELF-ORGANIZATION MATERIAL AND PATTERN FORMATION METHOD

(71) Applicant: Toshiba Memory Corporation, Tokyo (JP)

(72) Inventors: Takeshi Okino, Kanagawa (JP); Akira Watanabe, Kanagawa (JP); Naoko Kihara, Kanagawa (JP); Ryosuke Yamamoto, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/255,517

(22) Filed: Sep. 2, 2016

(65) Prior Publication Data

US 2017/0062206 A1    Mar. 2, 2017

(30) Foreign Application Priority Data

Sep. 2, 2015    (JP) .................. 2015-173153

(51) Int. Cl.
*H01L 21/027* (2006.01)
*G03F 7/00* (2006.01)
(Continued)

(52) U.S. Cl.
CPC ........ *H01L 21/0271* (2013.01); *G03F 7/0002* (2013.01); *B81C 1/00404* (2013.01);
(Continued)

(58) Field of Classification Search
CPC ... H01L 21/0271; G03F 7/0002; C09K 13/00; B81C 1/00404; B81C 2201/0149; G11B 5/8404; G11B 7/263
See application file for complete search history.

(56) References Cited

U.S. PATENT DOCUMENTS 7,029,592 B2 *  4/2006  Frendt ................... B82Y 10/00
                                                     216/11
8,808,557 B1     8/2014  Seino et al.
(Continued)

FOREIGN PATENT DOCUMENTS

JP     2004-303870     10/2004
JP     2014-078540      5/2014
(Continued)

OTHER PUBLICATIONS

N. N. Khanh et al., "Facile Organization of Colloidal Particles Into Large, Perfect One- and Two-Dimensional Arrays by Dry Manual Assembly on Patterned Substrates", *Journal of American Chemical Society*, 2009, vol. 131, No. 40, pp. 14228-14230.
(Continued)

*Primary Examiner* — Anita Alanko
(74) *Attorney, Agent, or Firm* — Finnegan, Henderson, Farabow, Garrett & Dunner, L.L.P.

(57) ABSTRACT

A pattern formation method according to an embodiment includes providing a substrate in which protrusions each having a tapered shape are provided on a main surface. The method further includes supplying the main surface with spherical particles equal in diameter to make the spherical particles arrange in a triangular lattice form such that each of the protrusions is at least partially positioned within a region surrounded by the main surface and three of the spherical particles adjacent to one another.

18 Claims, 7 Drawing Sheets

(51) Int. Cl.
- *C09K 13/00* (2006.01)
- *B81C 1/00* (2006.01)
- *G11B 5/84* (2006.01)
- *G11B 7/26* (2006.01)

(52) U.S. Cl.
CPC ...... *B81C 2201/0149* (2013.01); *C09K 13/00* (2013.01); *G11B 5/8404* (2013.01); *G11B 7/263* (2013.01)

(56) References Cited

U.S. PATENT DOCUMENTS

| | | | | |
|---|---|---|---|---|
| 9,064,522 | B2* | 6/2015 | Kanamaru | G11B 5/746 |
| 9,224,413 | B2* | 12/2015 | Kimura | G11B 5/855 |
| 2002/0136927 | A1* | 9/2002 | Hieda | G11B 5/74 428/845.5 |
| 2008/0053369 | A1 | 3/2008 | Park et al. | |
| 2009/0274873 | A1* | 11/2009 | Shinotsuka | B82Y 10/00 428/143 |
| 2012/0257281 | A1* | 10/2012 | Takagi | B29D 11/00798 359/599 |
| 2014/0097152 | A1 | 4/2014 | Hieda et al. | |
| 2014/0287265 | A1 | 9/2014 | Kimura et al. | |
| 2014/0374380 | A1 | 12/2014 | Kanamaru et al. | |
| 2016/0027461 | A1 | 1/2016 | Watanabe et al. | |

FOREIGN PATENT DOCUMENTS

| | | |
|---|---|---|
| JP | 2014-160734 | 9/2014 |
| JP | 2014-186776 | 10/2014 |
| JP | 2015-005321 | 1/2015 |
| JP | 2016-022459 | 2/2016 |

OTHER PUBLICATIONS

I. Bita et al., "Graphoepitaxy of Self-Assembled Block Copolymers on Two-Dimensional Periodic Patterned Templates". *Science*, vol. 321, Aug. 15, 2008; pp, 939-943.

* cited by examiner

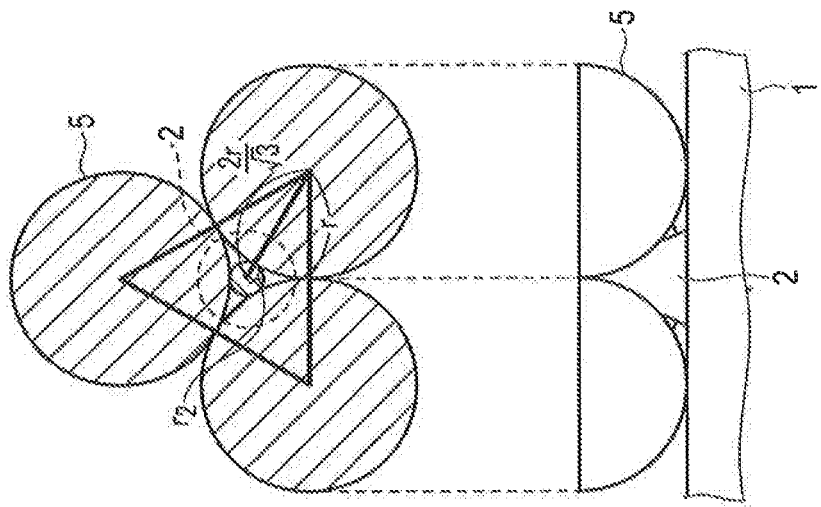
F I G. 7C
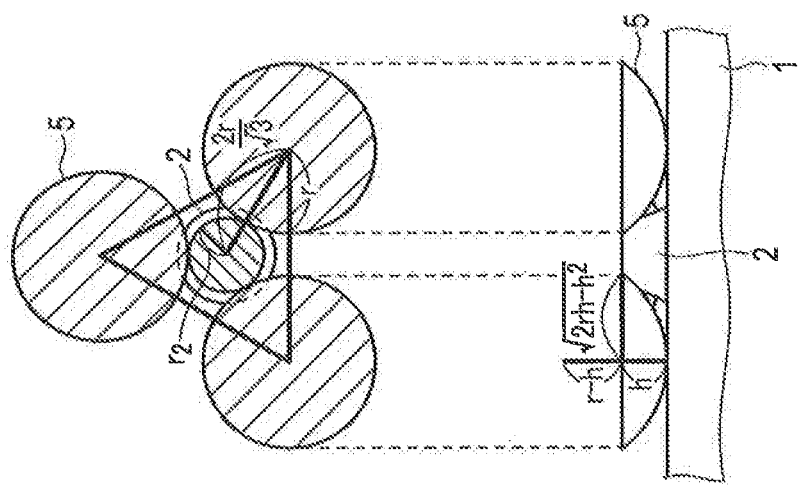
F I G. 7B
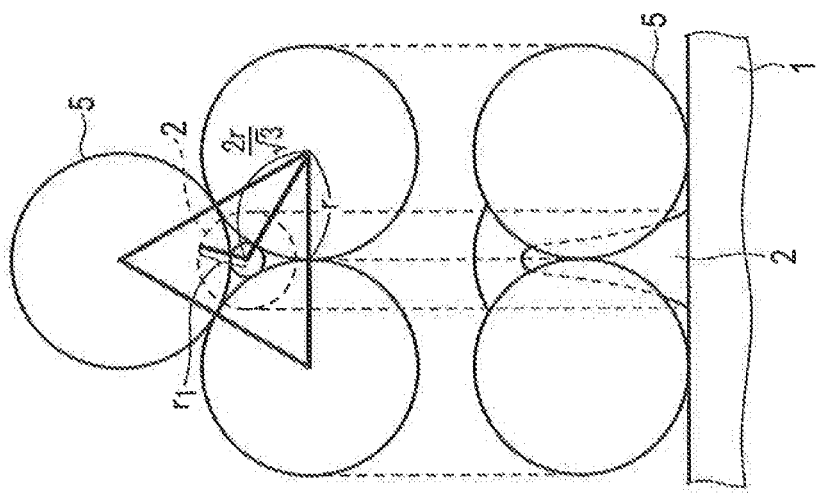
F I G. 7A

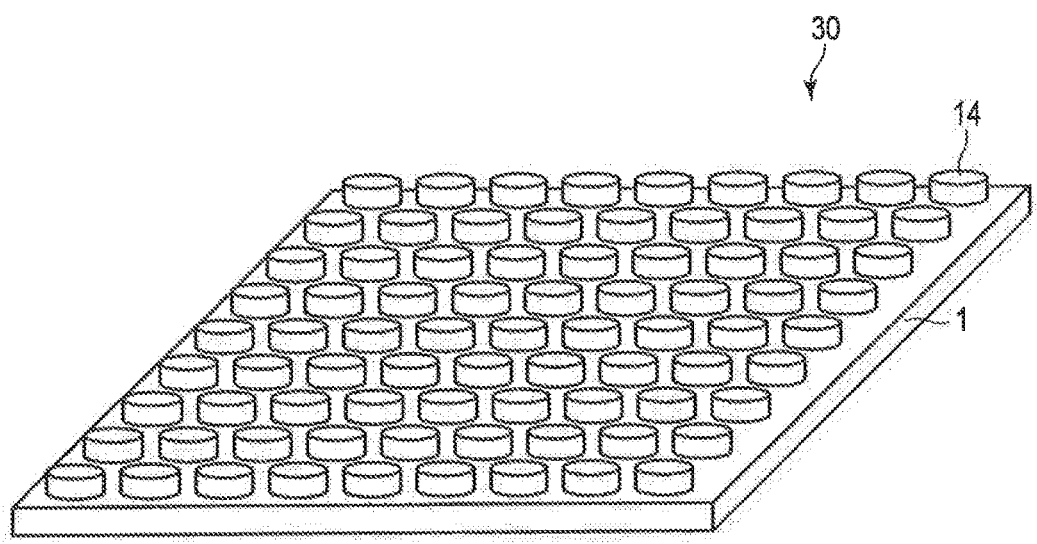
F I G. 10
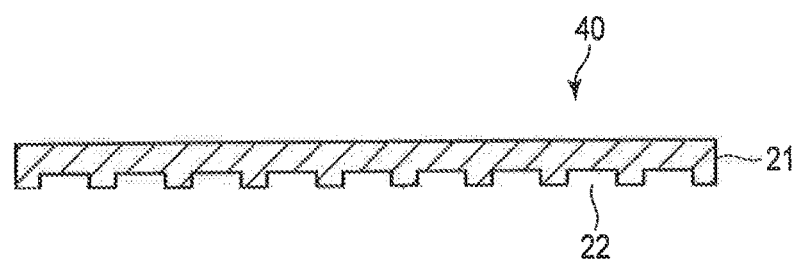
F I G. 11

SELF-ORGANIZATION MATERIAL AND PATTERN FORMATION METHOD

CROSS-REFERENCE TO RELATED APPLICATION

This application is based upon and claims the benefit of priority from Japanese Patent Applications No. 2015-173153, filed Sep. 2, 2015, the entire contents of which are incorporated herein by reference.

FIELD

Embodiments described herein relate generally to a pattern formation method, a stamper manufacturing method, and a device manufacturing method.

BACKGROUND

A microstructure in which recesses and protrusions are regularly arranged at intervals of tens of nanometers to hundreds of nanometers can be applied, for example, to a semiconductor device, a photonic device, and an anti-reflective film.

When forming such a microstructure, a method of writing a pattern on a resist film by using an electron beam lithography system or an exposure apparatus utilizing extreme ultraviolet (EUV) or ultraviolet light has been adopted. A method of utilizing a self-organization phenomenon of particles or diblock copolymer has been also adopted. The former method incurs high costs due to use of an expensive apparatus. The latter method is a bottom-up method using physical properties of a material, and does not need to use an expensive apparatus. Of the latter method, the pattern formation method utilizing the self-organization phenomenon of particles can use as a material of spherical particles, not only an organic material such as a resist or diblock copolymer, but also an inorganic material such as a metallic material. Accordingly, it is easy to select a material that can achieve a desired etching selectivity in an etching process that is carried out for the subsequent transfer.

BRIEF DESCRIPTION OF THE DRAWINGS

FIGS. 7A to 7C are views each showing the relationship between the size of spherical particles and the size of a protrusion;

FIG. 10 is a perspective view schematically showing a protruding pattern formed by the method according to the embodiment; and FIG. 11 is a cross-sectional view schematically showing a stamper formed by the method according to the embodiment.

DETAILED DESCRIPTION

According to an embodiment, there is provided a pattern formation method comprising providing a substrate in which protrusions each having a tapered shape are provided on a main surface, and supplying the main surface with spherical particles equal in diameter to make the spherical particles arrange in a triangular lattice form such that each of the protrusions is at least partially positioned within a region surrounded by the main surface and three of the spherical particles adjacent to one another.

Embodiments will be described with reference to the drawings.

Figure 1:
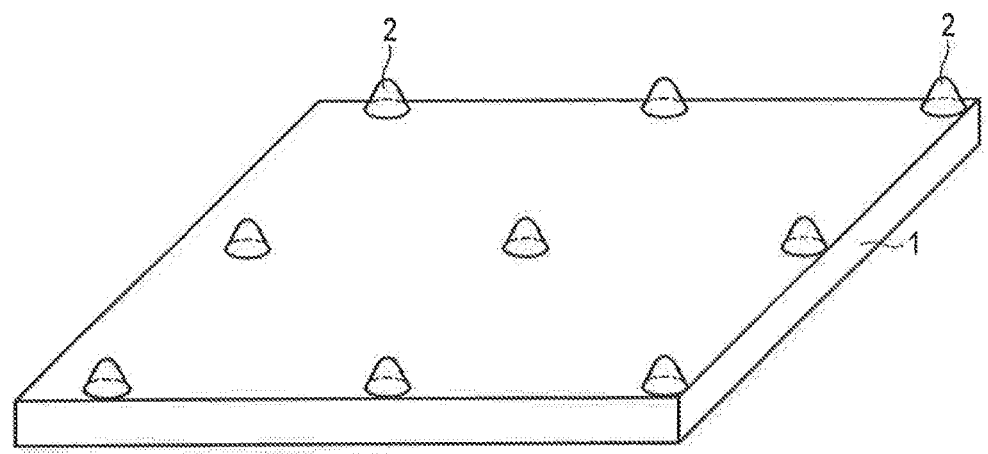
FIG. 1 is a perspective view schematically showing a substrate having protrusions in use for a method according to an embodiment.

In a pattern formation method of the embodiment, first, a substrate 1 having protrusions 2 on a main surface thereof is prepared as shown in FIG. 1. For example, a silicon wafer, a wafer made of a compound semiconductor such as GaAs or AlGaAs, a quartz substrate, a sapphire substrate, an indium tin oxide (ITO) substrate, a substrate made of amorphous semiconductor containing indium, gallium, zinc, and oxygen (IGZO), a substrate coated with a spin-on-glass, or a substrate with a carbon layer formed thereon by sputtering can be used as the substrate 1. The substrate may have a hard mask layer to improve an etching selectivity. The details of the protrusions 2 will be described later.

Next, spherical particles equal in diameter are supplied onto the main surface having the protrusions 2. The spherical particles equal in diameter are not limited to spherical particles whose diameters are exactly the same, but may be spherical particles whose diameters are nearly the same. That is, the expression "equal in diameter" does not exclude unavoidable variations in diameter.

As the method of supplying spherical particles, for example, a spin coating method, a dip coating method, or a Langmuir (L) method may be used.

In the spin coating method, a dispersion containing spherical particles is dripped onto the main surface of the substrate 1 and the substrate 1 is rotated to form a coating film, and then the coating film is dried to remove the dispersion medium. In this case, the film thickness can be controlled by adjusting the content of spherical particles in the dispersion or by the rotational speed.

In the dip coating method, a dispersion containing spherical particles is poured into a container, and the substrate 1 is immersed into the dispersion in the container. Spherical particles adhere to the substrate 1 due to viscous force and intermolecular force applied when the substrate 1 is withdrawn from the dispersion. The film thickness can be controlled by adjusting the content of spherical particles in the dispersion or the withdrawal speed. Excess dispersion is discarded in the spin coating method, whereas excess dispersion is returned to the container in the dip coating method, and this reduces waste.

In the L method, spherical particles each having a protecting group on the surface are used. The spherical particles are mixed with a dispersion medium which has a low affinity for the protecting group. The types and mixing ratio of the spherical particle and the dispersion medium are selected such that the spherical particles float to the surface of the dispersion medium so as to form a layer of the spherical particles with a thickness that is the same as a diameter of the particle. When the substrate 1 is immersed into the dispersion, and then the substrate 1 is withdrawn from the dispersion, spherical particles can be attached to the substrate 1.

A primary coat may be formed on the main surface of the substrate 1 before supplying the spherical particles. The primary coat may be a layer made, for example, of polystyrene.

Figure 2:
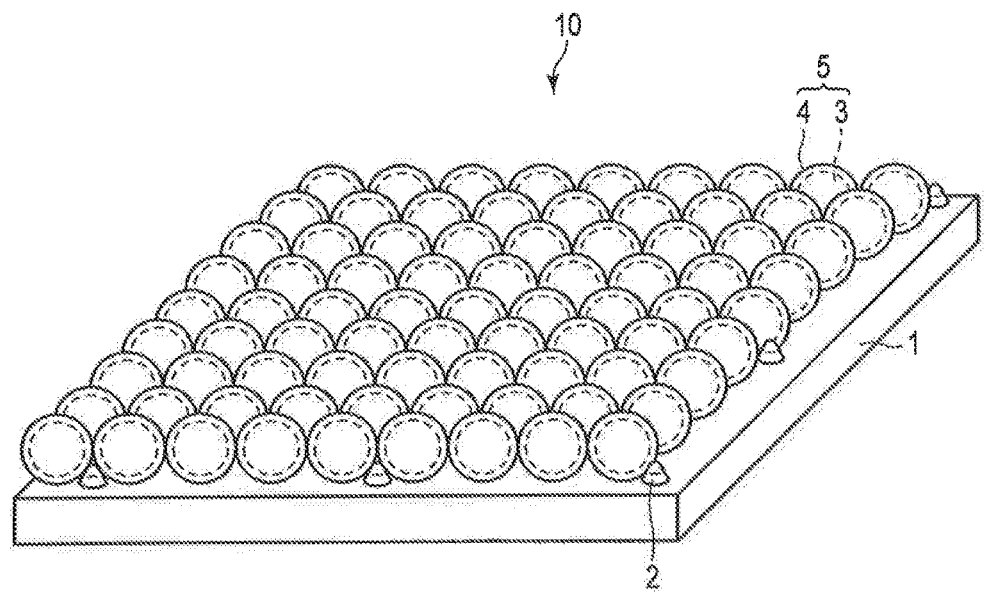
FIG. 2 is a perspective view schematically showing a first pattern formed by the method according to the embodiment.
Figure 3:
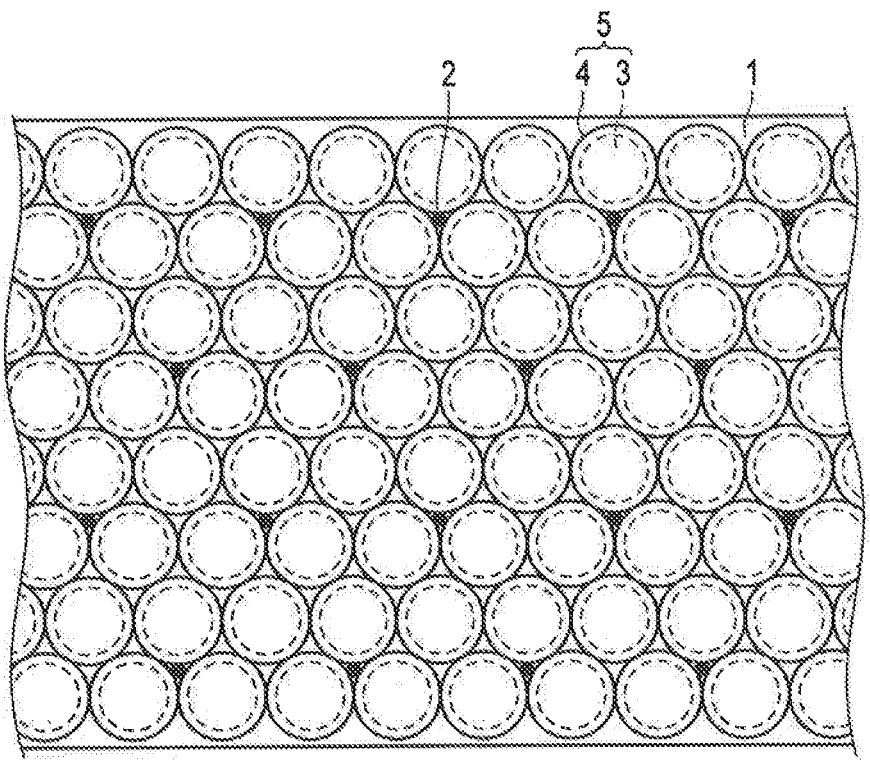
FIG. 3 is a plan view schematically showing the first pattern of FIG. 2.
Figure 4:
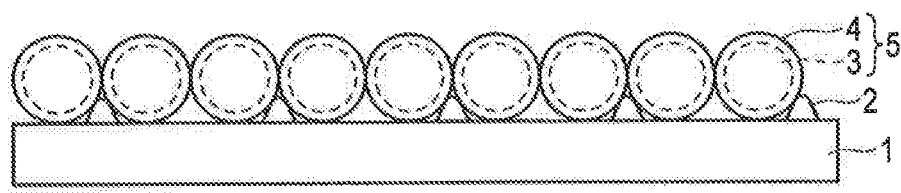
FIG. 4 is a side view schematically showing the first pattern of FIG. 2.

As described above, by supplying the spherical particles on the main surface having the protrusions 2, a layer formed of the spherical particles and having a thickness of a single particle size can be formed on the substrate 1. If the protrusions 2 are arranged at predetermined positions on the main surface, a pattern 10 (hereinafter, referred to as "first pattern") in which spherical particles 5 are arranged in a triangular lattice form, and in which the position and the orientation of the triangular lattice are controlled by the protrusions 2, is obtainable as shown in FIGS. 2 to 4. Note that FIGS. 2 to 4 illustrate core shell particles each including a core 3 and a shell 4, as an example of the spherical particles 5. The details of the spherical particles 5 will be explained later.

As shown in FIGS. 2 to 4, in the first pattern 10, the spherical particles 5 are arranged in a triangular lattice form such that line segments connecting the centers of adjacent three spherical particles 5 form a regular triangle. A spherical particle 5 is in contact with six spherical particles 5 surrounding the former spherical particle 5. Due to variation in diameters of the spherical particles 5, the number of spherical particles 5 in contact with one spherical particle 5 may be 5 or less or 7 or more.

The spherical particles 5 may be arranged in a square lattice form by changing an arrangement of the protrusions 2. The pattern in which the spherical particles 5 are arranged in the triangular lattice form, however, realizes the highest density of the spherical particles and greatest stability.

In the first pattern 10, each of the protrusions 2 is at least partially positioned in a region surrounded by the adjacent three spherical particles 5 and the main surface of the substrate 1. The entire protrusion 2 may be positioned in the region, or a part of the protrusion 2 may be positioned in the region, and the rest of the protrusion 2, for example, a tip, may be positioned outside the region.

The protrusions 2 have a tapered shape. The tapered shape indicates a shape where an area of a cross-section parallel to the bottom surface monotonically decreases as the distance between the cross-section and the bottom surface, i.e., the height of the cross-section increases, or a shape that consists of one or more portions in which an area of the cross-section parallel to the bottom surface monotonically decreases as the height of the cross-section increases and one or more portions in which an area of the cross-section parallel to the bottom surface does not change regardless of an increase of the height. The tapered shape includes a shape in which the cross-sectional area gradually decreases from a bottom surface toward a tip, a shape consisting of a portion whose cross-sectional area is fixed and a portion whose cross-sectional area gradually decreases, and a shape consisting of a lower portion having the same cross-sectional area as the bottom surface area and an upper portion having a cross-sectional area smaller than the bottom surface area. The tapered shape can provide a wider bottom surface area which is in contact with the substrate 1. Accordingly, the protrusions 2 of the tapered shape decrease the probability of destruction, and stably support the spherical particles 5. The tips of the protrusions 2 may be sharply pointed or rounded.

The protrusion 2 has preferably a pyramidal or cone shape, and more preferably a circular cone shape. The protrusions 2 each shaped as a circular cone can support the spherical particles 5 uniformly and stably regardless of the directions in which the spherical particles 5 are arranged. The protrusion 2 may have a pyramidal shape such as a triangular pyramidal shape or hexagonal pyramidal shape. In this case, it is preferable to adjust the directions of the sides of the bottom surface in accordance with the directions in which the spherical particles 5 are arranged.

The cone or pyramidal shape may not be a perfect cone or pyramidal shape, but may include an approximately cone or pyramidal shape. For example, a cone or pyramidal shape includes a cone or pyramidal shape having a rounded tip or a pyramidal shape having rounded edges.

The protrusion 2 may have a truncated cone shape such as a circular truncated cone shape, or a truncated pyramidal shape such as a triangular truncated pyramidal shape or a hexagonal truncated pyramidal shape. The truncated cone or pyramidal shape may not be a perfect truncated cone or pyramidal shape, but may include an approximately truncated cone or pyramidal shape. For example, a truncated cone or a pyramidal shape includes a truncated pyramidal shape having rounded edges.

Each protrusion 2 is preferably designed to have a size that allows it to be in contact with all of the three adjacent spherical particles 5. With this structure, the positions of the spherical particles 5 can be restricted with high accuracy. Each protrusion 2 may have a size smaller than that allows the protrusion 2 to be in contact with all of the three adjacent spherical particles 5. The positions of the spherical particles 5 can be restricted even in the case where each protrusion 2 is in contact with one or two of the three adjacent spherical particles 5.

When viewed from the direction perpendicular to the main surface of the substrate 1, the entire protrusion 2 is preferably located within a triangle formed by line segments that connect the centers of the adjacent three spherical particles 5 together, and more preferably located at a median point of the triangle.

Figure 5:
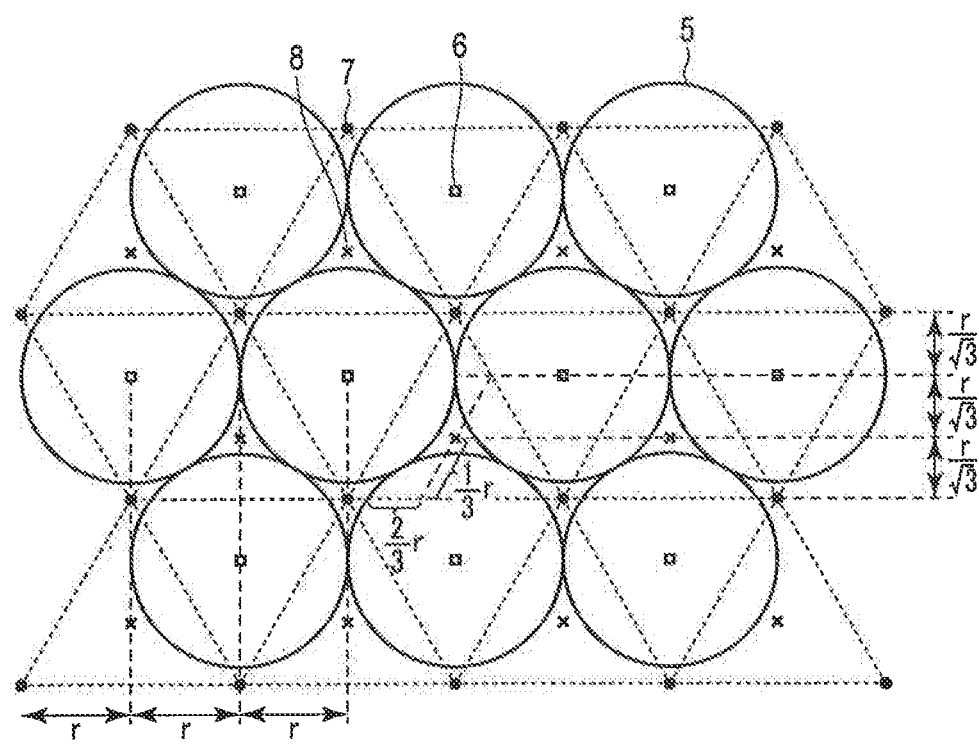
FIG. 5 is a plan view schematically showing a virtual triangular lattice on the substrate and the arrangement of spherical particles in the first pattern of FIG. 2.

The protrusions 2 are provided on the main surface such that each protrusion 2 is located at any of lattice points of the virtual triangular lattice on the main surface of the substrate 1. FIG. 5 is a schematic diagram to explain the arrangement of the spherical particles 5 in relation to the virtual triangular lattice on the main surface of the substrate 1. The shortest distance between the lattice points of the triangular lattice is equal to the diameter of a spherical particle 5. The protrusions 2, which is omitted in FIG. 5, are provided on the lattice points 7 of the triangular lattice. By placing the protrusions 2 at the lattice points 7 of the triangular lattice, the spherical particles 5 can be arranged in a triangular lattice form on the main surface. The protrusions 2 may be placed at some of the lattice points 7 of the triangular lattice, and do not have to be placed at all of the lattice points 7.

Triangles that are obtained by connecting the lattice points 7 of the triangular lattice by line segments include triangles of a first orientation and triangles of a second orientation opposite to the first orientation. The median point of a triangle of the first orientation is a first median point 6, and the median point of a triangle of the second orientation is a second median point 8.

In the preferred embodiment, some of the protrusions 2 are provided on the lattice points 7, and the rest of the protrusions 2 are provided on the second median points 8. If some of the protrusions 2 are provided on the lattice points 7, some of the rest of the protrusions 2 are provided on the first median points 6, and the rest of the protrusions 2 are provided on the second median points 8, a structure in which spherical particles 5 are placed on the first median points 6 and a structure in which spherical particles 5 are placed on the second median point 8 are mixed. This mixture may inhibit regular arrangements of the spherical particles 5. The structure where the protrusions 2 are placed only on the lattice points 7 and the second median points 8 can eliminate the probability of producing the structure where the spherical particles 5 are placed on the second median points 8, and more reliably produces the structure where the spherical particles 5 are placed on the first median points 6.

Figure 6A:
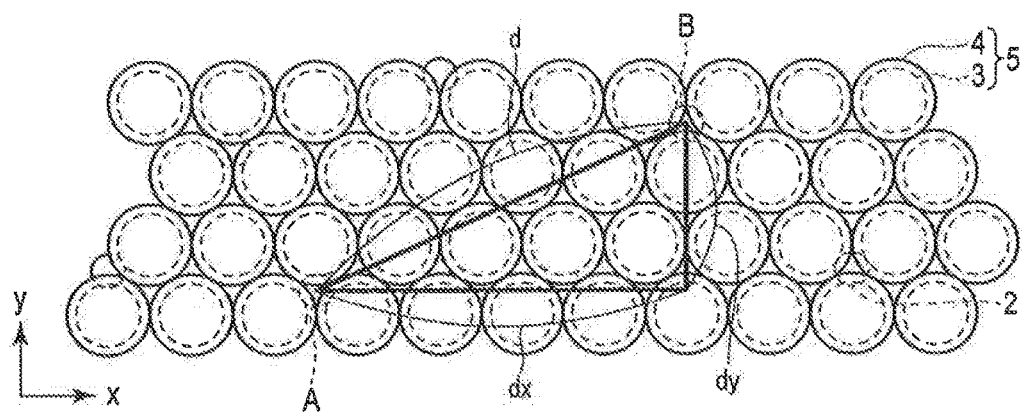
FIGS. 6A and 6B are plan views to explain equations (4) and (7)
Figure 6B:
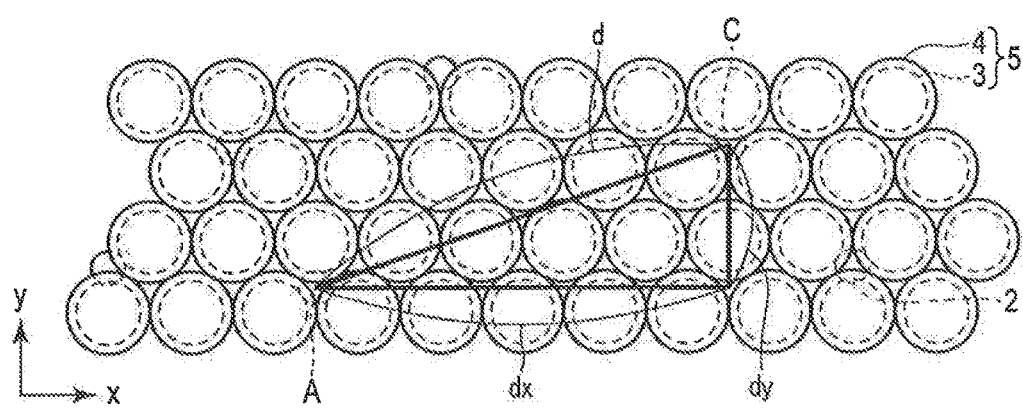

FIGS. 6A and 6B are schematic diagrams to explain the center-to-center distance d of the protrusions 2. In FIGS. 6A and 6B, the direction x is one of the directions in which the spherical particles 5 are arranged, and the direction y is a direction perpendicular to the direction x. The radius of a spherical particle 5 is represented as r, and the center-to-center distance of the adjacent spherical particles 5 is represented as 2r. The radius of the spherical particle 5 measured under the condition where one particle is solely present may be different from the radius of the spherical particle 5 measured under the condition where the particle is arranged along with other particles due to the attractive force or repulsive force between the particles or variations in particles. Except for the cases where the spherical particles 5 are arranged with spaces therebetween so as to not be in contact with each other, it is assumed that if the average distance between the centers of the adjacent spherical particles 5, which are self-assembled, is 2r, the radius of the spherical particle 5 is r.

The center-to-center distance d of the protrusions A and B shown in FIGS. 6A and 6B is calculated by equation (1) below. In equation (1), $d_x$ represents a distance between the center of the protrusion A and an intersection point of a line passing through the center of the protrusion A and parallel to the direction x, and a line passing through the center of the protrusion B and parallel to the direction y; and $d_y$ represents a distance between the center of the protrusion B and the intersection point.

$$d^2 = d_x^2 + d_y^2 \quad (1)$$

FIG. 6A shows a structure where the protrusions included in either of the group of the protrusions A and the group of the protrusions B are placed on the lattice points 7 shown in FIG. 5, and the protrusions included in another group are placed on the second median point 8 shown in FIG. 5. FIG. 6B shows a structure where both of the protrusions A and B are placed on the lattice points 7 (or second median points 8) shown in FIG. 5.

If the protrusions A and B are arranged as shown in FIG. 6A, the distances $d_x$ and $d_y$ are given by the following equations (2) and (3), respectively.

$$d_x = |(3h+2i)r| \quad (2)$$

$$d_y = \left|\frac{(3h+6i+6j-2)r}{\sqrt{3}}\right| \quad (3)$$

Thus, the center-to-center distance d of the protrusions A and B shown in FIG. 6A is given by the following equation (4).

$$d = \sqrt{(3h+2i)^2 + \frac{(3h+6i+6j-2)^2}{3}} \times r \quad (4)$$

In the equation (4), r represents the radius of the spherical particle 5, and h, i, and j independently represent an integer.

If the protrusions A and B are arranged as shown in FIG. 6B, the distances $d_x$ and $d_y$ are given by the following equations (5) and (6), respectively.

$$d_x = |mr| \quad (5)$$

$$d_y = \left|\frac{2m+4n}{\sqrt{3}}r\right| \quad (6)$$

Thus, the center-to-center distance d of the protrusions A and B shown in FIG. 6B is given by the following equation (7).

$$d = \sqrt{\frac{|2m^2 + 4mn + 4n^2|}{3}} \times 2r \quad (7)$$

In the equation (7), r represents the radius of the spherical particle 5, and m and n independently represent an integer. There is no case where both of m and n are zero at the same time.

As can be clearly seen from the explanation regarding FIG. 5, it is preferable that the protrusions 2 are provided on the main surface of the substrate 1 such that the center-to-center distances d of the protrusions 2 satisfy the equation (4) or (7), in order to arrange the spherical particles 5 on the substrate 1 with high density.

The center-to-center distances d of the protrusions 2 are preferably 4r or more. Such distances d facilitate smooth movement of the spherical particles 5 and self-assembly of spherical particles 5. The center-to-center distances d of the protrusions 2 are preferably 20r or less, and more preferably 10r or less. With such distances d, the spherical particles can be placed at desired positions with high accuracy.

It is preferable that three or more protrusions 2 are present within a particle layer-forming area on the main surface. If three or more protrusions 2 are present within the area, it is preferable that at least one protrusion 2 is not placed on the straight line that passes through the lattice points on which the other two or more protrusions 2 are placed.

The number of the protrusions 2 may, for example, be almost the same as that of the spherical particles 5 arranged on the main surface. In this case, the spherical particles 5 can be accurately arranged at desired positions. If the center-to-center distance of the protrusions 2 is short, it becomes difficult to form protrusions 2. If the gaps between protrusions 2 are small, the protrusions 2 may excessively prevent the movement of the spherical particles 5 on the main surface.

In addition to the tapered protrusions 2, a protrusion having a shape of a straight line or a curved line when viewed in the direction perpendicular to the main surface of the substrate 1 may be formed on the main surface. The straight line- or curved line-shaped protrusion is, for example, provided to extend along an outer peripheral of an area where the spherical particles 5 are arranged so as to surround the area. Using both of the tapered protrusions and the straight line- or curved line-shaped protrusions facilitates control of the arrangement of the spherical particles 5.

A buffer area may be provided between an area where the spherical particles 5 are arranged and the straight line- or curved line-shaped protrusion. On the buffer area, it is preferable that the protrusions 2 are provided such that the center-to-center distances d of the protrusions 2 are less than 4r. With this structure, the positions of the spherical particles 5 can be easily controlled on the buffer area.

Next, the relationship between the size of the spherical particles 5 and the size of the protrusions 2 will be explained with reference to FIGS. 7A to 7C. The radius of the spherical particle 5 is r. The distance k between two intersection points, that is, an intersection point of the substrate 1 and a vertical line passing through a center of a triangle formed by connecting the centers of three adjacent spherical particles 5 with line segments, and an intersection point of the substrate 1 and a vertical line passing through the center of the spherical particle 5 is given by the following equation (8).

$$k = \frac{2r}{\sqrt{3}} \quad (8)$$

It is preferable that the radius r of the bottom of the protrusion 2 shown in FIG. 7A satisfies the relationship represented by the following equation (9).

$$r_1 \leq \frac{2r}{3} \quad (9)$$

If the bottom of the protrusion 2 does not have a circular shape, a radius of a circumcircle of the bottom can be assumed to be the radius $r_1$.

When a cross section of the spherical particle 5 at a height h from the substrate 1 is considered as shown in FIG. 7B, the radius $r_h$ of the cross section is given by the following equation (10).

$$r_h = \sqrt{2rh - h^2} \quad (10)$$

when a cross section of the protrusion 2 at the height h from the substrate 1 is considered, a radius $r_2$ of the cross section preferably satisfies the relationship represented by the following equation (11).

$$r_2 \leq \frac{2r}{\sqrt{3}} - \sqrt{2rh - h^2} \quad (11)$$

If a cross section of the protrusion 2 does not have a circular shape, a radius of a circumcircle of the cross section can be assumed to be the radius $r_2$.

When assuming the height h from the substrate 1 is equal to the radius r of the spherical particle 5 as shown in FIG. 7C, the radius $r_2$ of the cross section of the protrusion 2 at the height h preferably satisfies the relationship represented by the following equation (12).

$$r_2 \leq \left(\frac{2}{\sqrt{3}} - 1\right)r \quad (12)$$

If each protrusion 2 satisfies the relationships represented by the equations (9) and (11), the protrusions 2 never obstruct the arrangement of the spherical particles 5. Accordingly, the spherical particles 5 can be arranged with high density in this case.

It is preferable that each protrusion 2 has a height smaller than the radius of the spherical particle 5.

The protrusions 2 may be, for example, made from a thermosetting resin, a photo-setting resin, or a room temperature curable material, but not limited thereto.

The protrusions 2 may be formed on the main surface of the substrate 1 by, for example, a method that includes irradiating a radiation-sensitive resin composition with an electronic beam, ArF (argon fluoride) excimer laser beam, KrF (krypton fluoride) excimer laser beam, extreme ultraviolet (EUV) light, or a g line (436 nm) or i line (365 nm) of mercury lamp, and then developing the composition.

A method of performing imprinting on the substrate 1 by using a stamper may be used as another method of forming the protrusions 2 on the main surface of the substrate 1. According to an embodiment, a stamper for forming the protrusions 2 is provided.

The method of forming the protrusions 2 on the main surface of the substrate 1 by using the stamper includes, for example, forming a resin layer on the main surface of the substrate 1, bringing a stamper having recesses into contact with the resin layer, curing the resin layer in the state where the stamper is in contact with the layer, and removing the stamper from the cured resin layer to obtain a resin layer having a surface provided with protrusions corresponding to the recesses of the stamper. As the above resin, thermosetting resin or a photo-setting resin may be used.

Alternatively, the protrusions may be formed by a room temperature nanoimprinting technique that uses a room temperature curable material such as a spin-on-glass (SOG) or hydrogen silsesquioxane (HSQ) is used instead of the above resin.

The stamper has recesses in which an area of the bottom is smaller than an area of the opening, for example. The stamper having the recesses in which the area of the bottom is small may be manufactured by providing a hard mask on a stamper substrate made, for example, of quartz, and performing etching under an etching condition in which the hard mask is retreated.

An example of a method of forming the protrusions 2 on the main surface of the substrate 1 will be explained. In this example, a stamper is first manufactured. Specifically, a negative resist layer is formed as a photosensitive material layer (resist layer) on a quartz substrate. An electron beam lithography is performed on the negative resist layer, and the negative resist layer is developed. By the above processing, protrusions made of the resist are formed to have a base area smaller than a target base area of the protrusion 2.

Next, Ni is vacuum evaporated on the surface of the quartz substrate having the protrusions made of the resist. Then, the protrusions made of the resist are removed. By this processing, openings are formed on the Ni layer at the positions where the protrusions made of the resist were present. Thus a hard mask layer is obtained on the quartz substrate.

Next, the quartz substrate is etched by using the hard mask layer as an etching mask. In this case, reactive ion etching is performed under a sufficiently high bias voltage. By this kind of etching, openings of the hard mask layer are widened in accordance with the progress of etching, and accordingly, tapered recesses are formed on the quartz substrate. The stamper having recesses (also referred to as an imprint mold) is accordingly obtained.

Protrusions 2 are formed on the main surface of the substrate 1 by using the stamper. Specifically, a resin layer of a photo-setting resin is formed on the main surface of the substrate 1. The stamper obtained as described above is brought into contact with the resin layer. Next, the resin layer is UV cured, and the stamper is removed from the cured resin layer.

By the above method, the protrusions 2 are formed on the main surface of the substrate 1.

The spherical particles 5 will be explained below. The shape of the spherical particle 5 may be an approximately sphere shape, and is not limited to a perfect spherical shape. The spherical particle 5 may be made of a single component or multiple components.

As shown in FIGS. 2 to 4, 6A, 6B, 7A, and 7C, the spherical particles 5 are preferably core-shell particles each including a core 3 and a shell 4 that covers the core 3 and is made of a component different from the component of the core 3. The shell 4 may have a plurality of layers of different components. For the shell 4 having a plurality of layers, if the outermost layer is approximately spherical, the other layers and the core 3 may have a planer shape.

The radius of the spherical particle 5 is preferably within the range of 10 nm or more and 100 nm or less, and more preferably within the range from 30 nm to 80 nm. If the spherical particles 5 have a suitable size, the smaller variance of the particle diameter is, the higher degree of order the spherical particles 5 can be arranged on the main surface of the substrate 1.

The spherical particles 5 are made of a material that can be etched at an etching rate lower than that of the protrusions 2. If the spherical particles 5 are core-shell particles, it is preferable that the shells 4 are made of a material that can be etched at an etching rate lower than that of the protrusions 2, or a material that can be etched at an etching rate almost the same as that of the protrusions 2. The cores 3 are made of a material that can be etched at an etching rate lower than that of the shells 4 and the protrusions 2.

The cores 3 are preferably made of an inorganic material such as a metal or a metal compound. Specifically, the material of the cores 3 are preferably a material selected from Al, Si, Ti, V, Cr, Mn, Fe, Co, Ni, Zn, Y, Zr, Sn, Mo, Ta, W, Au, Ag, Pd, Cu, and Pt; or an oxide, a nitride, a boride, a carbide, or a sulfide thereof.

The shells 4 are preferably made of an organic material or silica. For example, an organic compound having a main chain formed of carbon atoms may be used as the organic material. This compound may be a compound including only a single bond, or a compound including one or more double bonds and/or triple bonds. An aromatic hydrocarbon may be used as the organic material.

A polymer may also be used as the organic material. Examples of the polymer include polystyrene, polyester, polyether, epoxy resin, polyurethane, polymethyl methacrylate, and polypropylene, etc.

A compound having a carboxy group may also be used as the organic material. Examples of such a compound include a saturated hydrocarbon such as capric acid, lauric acid, palmitic acid, or stearic acid; and an unsaturated hydrocarbon such as palmitoleic acid, oleic acid, linoleic acid, or linolenic acid.

A compound having a thiol group may also be used as the organic material. Examples of the compound having a thiol group include a saturated hydrocarbon having a thiol group and an unsaturated hydrocarbon having a thiol group.

Examples of the core-shell particle include a spherical particle in which a core is made of gold and a shell is made of polystyrene; a spherical particle in which a core is made of gold and a shell is made of silica; a spherical particle in which a core is made of silica and a shell is made of polystyrene; and a spherical particle in which a core is made of silica and a shell is made of polymethyl methacrylate.

As described above, according to the pattern formation method of the embodiment, the protrusions 2 do not obstruct arrangement of the spherical particles 5, thereby obtaining a pattern 10 in which the spherical particles 5 are arranged in a regular manner with high density.

The pattern formation method of the embodiment may include additional processing steps. The method may include, for example, a step of subjecting the first pattern 10 to the process selected from etching, developing, spattering, chemical vapor deposition (CVD), atomic layer deposition (ALD), and electroforming.

The pattern formation method of the embodiment may include, for example, a step of removing the protrusions 2 and the shell 4 of each spherical particle 5 such that the core 3 of each spherical particle 5 remain in the first pattern 10. The protrusions 2 and the shells 4 may be removed by etching. To simplify this step, it is preferable to remove the protrusions 2 and the shells 4 at the same time. It is possible to remove only the protrusions 2 first, and then remove the shells 4, or vice versa.

When the protrusions 2 and the shells 4 are simultaneously removed, their materials are selected to be etched at almost the same etching rate. The etching rate is set to be higher than the etching rate of the material of the cores.

Figure 8:
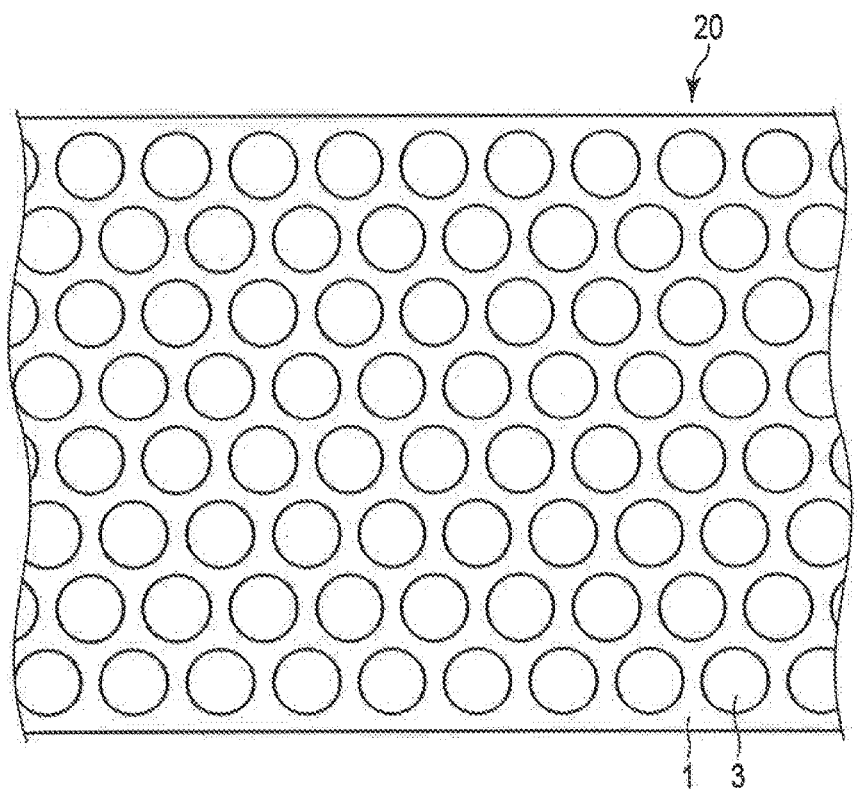
FIG. 8 is a plan view schematically showing a second pattern formed by the method according to the embodiment.
Figure 9:
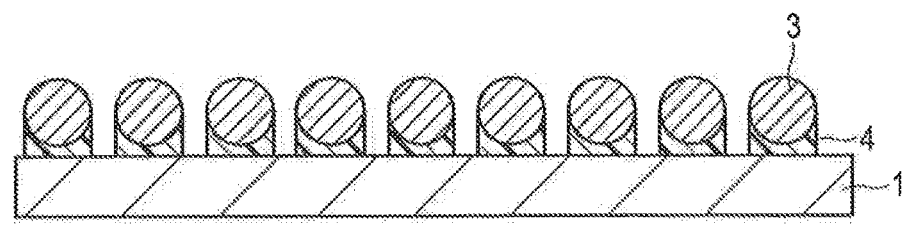
FIG. 9 is a cross-sectional view schematically showing the second pattern of FIG. 8.

After the protrusions 2 and the shells 4 are removed, only the cores 3 of the spherical particles 5 remain on the main surface of the substrate 1 as shown in FIGS. 8 and 9. The pattern having the remaining cores 3 is called a second pattern 20. In the second pattern 20, the distance between adjacent cores 3 can be controlled by adjusting the thickness of the shells 4 of the spherical particles 5.

If the spherical particles 5 do not have a core-shell structure, a second pattern 20 in which only the spherical particles 5 remain can be obtained by removing only the protrusions 2 by etching. In this case, the protrusions 2 may be provided such that the center-to-center distance d of the protrusions 2 is equal to the arrangement pitch of the spherical particles 5, namely, the spherical particles and the protrusions have a one-to-one relationship. Accordingly, if the protrusions 2 are sufficiently large, spaces of equal size can be formed among the spherical particles 5. That is, the size of the spaces between the spherical particles 5 can be controlled by adjusting the size of the protrusions 2.

The pattern formation method of the embodiment may include additional processing steps. For example, the method may include a step of processing the main surface of the substrate 1 by using the second pattern 20 having the cores 3 as a mask, or a step of processing the main surface of the substrate 1 by using the second pattern 20 formed of the cores 3 as a seed layer. The processing here includes etching, developing, spattering, CVD, ALD, and electroforming.

A process using the cores 3 as a mask will be explained as an example.

First, the second pattern 20 including the cores 3 is formed, and the substrate 1 is etched by using the cores 3 as a mask. Next, the cores 3 and the remaining portions of the shells 4 positioned below the cores 3 are removed. By this process, a protruding pattern 30 having columnar protrusions 14 is formed as shown in FIG. 10.

Alternatively, the second pattern 20 formed of the cores 3 is formed first. Next, a layer made of a material that can be etched at an etching rate lower than that of the protrusions 3 is formed on the second pattern 20. Then, this layer is planarized to expose the cores 3, if necessary. After that, etching is performed by using the above layer as an etching mask to remove the core 3, the remaining portions of the shells 4 positioned below the cores 3, and portions of the substrate 1 positioned below the cores 3. By this process, a recessed pattern having columnar recesses is formed.

According to the aforementioned pattern formation method, the structure where columnar protrusions or recesses are regularly arranged with high density can be obtained without using high-cost exposure.

According to another embodiment, a stamper manufacturing method is provided. In the method, the protruding pattern or recessed pattern is first formed on the main surface of the substrate by the aforementioned pattern formation method. Next, electroforming is performed on the main surface in which the protruding pattern or recessed pattern is formed, to form a metal layer having a surface shape corresponding to the protruding pattern or recessed pattern. The electroforming may be performed by using Ni.

If a substrate having the protruding pattern on the main surface is used, a stamper 40 including a metal layer 21 having columnar recesses 22 as shown in FIG. 11 can be manufactured. On the other hand, if a substrate having the recessed pattern on the main surface is used, a stamper including a metal layer having columnar protrusions can be manufactured. The stamper 40 may include a supporting member that improves the strength of the metal layer 21.

According to the aforementioned method, the stamper where columnar protrusions or recesses are arranged in a regular manner with high density can be obtained.

According to another embodiment, a device manufacturing method using the pattern formed by the aforementioned method is provided. The device manufacturing method includes forming the protruding pattern or recessed pattern on the main surface of the substrate by the aforementioned pattern formation method, forming a resin layer on another substrate, and transferring the protruding pattern or recessed pattern onto the resin layer.

The device manufacturing method may use the stamper manufactured by the aforementioned stamper manufacturing method. For example, the stamper obtained by the aforementioned stamper manufacturing method is brought into contact with the resin layer formed on the substrate such as a semiconductor substrate. In this state, the resin layer is cured, and the stamper is then removed. By this process, a substrate having the resin layer onto which the protruding or recessed pattern is transferred is obtained. The substrate is subjected to additional processing steps such as etching, electroforming, or film forming and lift-off. Accordingly a device in which a main surface of the substrate has a protruding pattern or a recessed pattern can be manufactured.

The device may be a semiconductor device such as a semiconductor memory device, but is not limited thereto. As the semiconductor memory device, a semiconductor three-dimensional memory (Bit Cost Scalable Memory (BiCS)) may be applied. BiCS is a mass memory having a structure where silicon electrode layers and silicon oxide insulation layers are alternately stacked, and columnar electrodes are inserted into through-holes formed in the stack. The device manufacturing method of the embodiment may be suitably applied to manufacturing of such BiCS.

Example 1

A negative resist layer was formed as a photosensitive material layer (resist layer) on a main surface of a quartz substrate. An electron beam lithography was performed on the negative resist layer, and the negative resist layer was then developed to form a plurality of protrusions made from the resist and each having a base area smaller than a base area of a target protrusion.

Next, Ni was vacuum evaporated on the surface of the quartz substrate on which the protrusions made from the resist were formed. Then, the protrusions made from the resist were removed. By this processing, openings were formed in the Ni layer at the positions where the protrusions made from the resist had been present. A hard mask layer was thus formed on the quartz substrate.

Next, the quartz substrate was etched by using the hard mask layer as an etching mask. In this case, reactive ion etching was performed under a sufficiently high bias voltage. By this type of etching, openings of the hard mask layer were widened in accordance with the progress of etching, and accordingly, tapered recesses were formed on the quartz substrate. A stamper having recesses was thus obtained.

Protrusions were formed on a main surface of a silicon substrate by using the stamper. Specifically, a resin layer of a photo-setting resin was formed on the main surface of the silicon substrate. The stamper obtained as described above was brought into contact with the resin layer. Next, the resin layer was UV cured, and the stamper was removed from the cured resin layer. By the above process, protrusions positioned at lattice points of a triangular lattice and arranged in a hexagonal lattice were formed on the substrate. The center-to-center distance of the protrusions was 180 nm. Each protrusion had a height of about 25 nm. Residues left at the bottoms of the cured imprinted material were removed by etching.

Next, the following surface processing was performed on the silicon substrate. First, the silicon substrate was washed for 10 minutes by a UV washer. A solvent of propyleneglycol 1-monomethyl ether 2-acetate (PGMEA) was used, and polystyrene (PS) with a molecular weight of 9,800 having a hydroxy group at a terminal was diluted with the solvent to prepare a treatment liquid. The concentration of PS in the treatment liquid was 1% by mass.

The treatment liquid was dropped onto the main surface of the silicon substrate, and a coating film was formed by the spin coating method. Then, heat treatment was performed for 20 hours at 170° C. in a vacuum to form a layer made of PS on the main surface. After that, PGMEA was dropped onto the substrate, to dissolve excessive PS and wash the substrate. Then, the solvent was volatilized by high-speed rotation of the substrate to obtain a layer (adsorbent layer) made of PS on the surface of the silicon substrate.

Spherical particles were applied to the silicon substrate subjected to the surface processing by dipping method. Core-shell particles in each of which a core was made of gold (Au) and a shell was made of PS were used as the spherical particles. The spherical particles were manufactured by the following method.

Specifically, Au spherical particles (particle diameter of around 50 nm) manufactured by Aldrich were dispersed in water to prepare a dispersion. The dispersion was subjected to centrifugation, supernatant fluid was removed, and N,N- dimethylformamide (DMF) were added thereto. The above steps were performed several times to obtain a DMF dispersion.

In addition, PS with a molecular weight of 11,500 having a thiol group (—SH group) at a terminal was prepared and dissolved in toluene with the concentration of 1.0% by weight to prepare a PS solution.

The PS solution was put into the DMF dispersion and left for 24 hours. Then, the mixture was subjected to centrifugation, supernatant fluid was removed, and toluene was added thereto. The above steps were performed several times to obtain a toluene dispersion. The toluene dispersion was subjected to centrifugation, supernatant fluid was removed, and 2-butanon (MEK) was added thereto. The above steps were performed several times to obtain a MEK dispersion.

Next, the MEK dispersion was applied to the silicon substrate having the adsorbent layer. Specifically, the silicon substrate was immersed in the obtained MEK dispersion such that the main surfaces are perpendicular to the liquid surface, and remained stationary for 30 seconds to quell liquid surface undulations produced by the immersion. After that, the silicon substrate was withdrawn at a speed of 1 mm/sec. By this process, the main surface was supplied with the spherical particles. The spherical particles on the main surface were arranged in a triangular lattice form. It should be noted that when the silicon substrate is withdrawn from the MEK dispersion, part of spherical particles are attached onto a surface of the substrate that have not been subjected to surface processing. Thus, a step of removing such attached spherical particles may be added.

Next, the protrusions and the shells of the spherical particles arranged on the main surface were removed by oxygen RIE. By this processing, a pattern of the cores, which were Au particles, was formed on the silicon substrate. The silicon substrate was etched by immersing the substrate into a hydrofluoric-acid aqueous-solution containing hydrogen peroxide. Then, the cores, which were Au particles, were removed. By this processing, a pattern having columnar protrusions was formed on the silicon substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern formation method comprising:
   providing a substrate in which protrusions each having a tapered shape are provided on a main surface; and
   supplying the main surface with spherical particles equal in diameter to make the spherical particles arrange in a triangular lattice form such that each of the protrusions is at least partially positioned within a region surrounded by the main surface and three of the spherical particles adjacent to one another.

2. The method of claim 1, wherein each of the spherical particles is a core-shell particle including a core and a shell covering the core.

3. The method of claim 2, further comprising, after the spherical particles are arranged, removing the protrusions and the shell of each of the spherical particles such that the core of each of the spherical particles remains.

4. The method of claim 3, further comprising processing the main surface by using the remaining cores as a mask.

5. The method of claim 1, wherein the protrusions are provided on the main surface in such a manner that each of the protrusions is positioned on any of lattice points of a triangular lattice.

6. The method of claim 1, wherein two or more of the protrusions are provided on the main surface such that each of them is positioned on any of lattice points of a triangular lattice, and the remainders of the protrusions are provided on the main surface such that each of them is positioned on any of median points of triangles, triangles of a first orientation and triangles of a second orientation opposite to the first orientation being obtained when connecting adjacent lattice points of the triangular lattice by line segments, and the median points of the triangles being median points of the triangles of the first orientation.

7. The method of claim 6, wherein the protrusions are provided on the main surface with a center-to-center distance d calculated by the following equation (4) or (7):

$$d = \sqrt{(3h+2i)^2 + \frac{(3h+6i+6j-2)^2}{3}} \times r \tag{4}$$

$$d = \sqrt{\frac{|2m^2 + 4mn + 4n^2|}{3}} \times 2r \tag{7}$$

wherein
  in the equation (4), r represents a radius of the spherical particles, and h, i, and j each independently represent an integer, and
  in the equation (7), r represents a radius of the spherical particles, m and n each independently represent an integer, and m and n cannot be zero at the same time.

8. The method of claim 7, wherein the center-to-center distance d is 4r or more.

9. The method of claim 7, wherein the center-to-center distance d is 20r or less.

10. The method of claim 1, wherein each of the protrusions is formed to have a pyramidal shape.

11. The method of claim 1, wherein each of the protrusions is formed to have a circular cone shape.

12. The method of claim 1, wherein the protrusions are provided on the main surface such that a radius $r_1$ and a radius r satisfy a relationship of the following equation (9):

$$r_1 \leq \frac{2r}{\sqrt{3}} \tag{9}$$

wherein the radius $r_1$ is a radius of a bottom of each of the protrusions, and the radius r is a radius of each of the spherical particles.

13. The method of claim 1, wherein the protrusions are provided on the main surface such that a radius $r_2$ and a radius r satisfy a relationship of the following equation (11):

$$r_2 \leq \frac{2r}{\sqrt{3}} - \sqrt{2rh - h^2} \tag{11}$$

wherein the radius $r_2$ is a radius of each of the protrusions at a height h, and the radius r is a radius of each of the spherical particles.

14. The method of claim 1, wherein the protrusions are provided on the main surface such that each has a height lower than a radius r of the spherical particles.

15. The method of claim 1, wherein the spherical particles have a radius of 10 nm or more.

16. The method of claim 1, wherein the protrusions are formed by imprinting.

17. A method of manufacturing a stamper, comprising:
   forming a protruding pattern or a recessed pattern on a main surface of a substrate by the method of claim 1; and
   performing electroforming on the main surface having the protruding pattern or the recessed pattern formed thereon, to form a metal layer having a surface shape corresponding to the protruding pattern or the recessed pattern.

18. A method of manufacturing a device, comprising:
   forming a protruding pattern or a recessed pattern on a main surface of a substrate by the method of claim 1;
   forming a resin layer on another substrate; and
   transferring the protruding pattern or the recessed pattern onto the resin layer.

* * * * *